United States Patent [19]

Imai et al.

[11] Patent Number: 4,989,949

[45] Date of Patent: Feb. 5, 1991

[54] ARRANGEMENT FOR DISCRIMINATING WHETHER OR NOT SEMICONDUCTOR LASER IS FUNCTIONAL

[75] Inventors: Hajime Imai, Kawasaki; Hiroshi Nishimoto, Sagamihara, both of Japan

[73] Assignee: Fujitsu Limited, Kawasaki, Japan

[21] Appl. No.: 261,169

[22] Filed: Oct. 21, 1988

[30] Foreign Application Priority Data

Oct. 23, 1987 [JP] Japan .................................. 62-266560

[51] Int. Cl.$^5$ ............................. G01J 1/00; H01S 3/13
[52] U.S. Cl. .................................. 356/121; 250/201.1; 372/32
[58] Field of Search ..................... 356/121, 124.5, 73.1; 250/201, 201.4, 206.2; 372/30, 32, 38; 455/602, 605, 606

[56] References Cited

U.S. PATENT DOCUMENTS 3,896,398  7/1975  Ueki ...................................... 372/38
4,713,819 12/1987  Yoshikawa ............................. 372/38
4,719,358  1/1988  Matsumoto et al. ................. 455/602

*Primary Examiner*—Richard A. Rosenberger
*Assistant Examiner*—Hoa Pham
*Attorney, Agent, or Firm*—Staas & Halsey

[57] ABSTRACT

An arrangement for discriminating whether a semiconductor laser employed in a light transmission system is functional or non-functional includes a circuit for generating a pulse pattern repeatedly with a unit of a plurality of bits and outputting the pulse pattern to the semiconductor laser and a medium for passing a light pulse signal output from the semiconductor laser. Receiving equipment includes a circuit for regenerating the pulse pattern from the light pulse signal and outputting a regenerative pulse pattern, and a discriminating circuit responding to the regenerative pulse pattern.

The discriminating circuit discriminates whether or not a pseudo-pulse exceeding a predetermined threshold level appears at a specific position in the regenerative pulse pattern during a predetermined time interval, and indicates a result of the discrimination. Based on the indicated result, a discrimination of whether the laser is functional or not can be carried out with simplicity and high reliability and without troublesome labor, while the laser remains incorporated in the light transmission system.

14 Claims, 4 Drawing Sheets

ARRANGEMENT FOR DISCRIMINATING WHETHER OR NOT SEMICONDUCTOR LASER IS FUNCTIONAL

BACKGROUND OF THE INVENTION

1. Field of the Invention

The present invention relates to an arrangement for discriminating whether or not a semiconductor laser is functional and, more particularly, to a technique of determining whether or not a semiconductor laser employed in a transmitting equipment of a light transmission system is functional under a condition that the laser is kept incorporated into the system.

2. Description of the Related Art

In general, a semiconductor laser employed in a transmitting equipment of the light transmission system is modulated by current pulses of high speed, such as 2 Gb/s, and, usually, oscillated on a single wavelength. In such case, it is known that the wavelength of emission spectrum is shifted from the dominant mode to the next mode due, for example, to a change in temperature, a change in level caused by a rise of the current pulse, or the like. This phenomenon is known as a "mode hopping" or "mode jump".

When mode hopping occurs, an error arises in that, in the position at which a correct signal, e.g., data of "0", should appear, an incorrect signal, i.e., a pseudo-pulse of "1", appears due to a chromatic dispersion of an optical fiber. Although the error caused by the mode hopping indeterminately occurs, a frequency of occurrence of the error, hereinafter referred to as an error rate, exceeding a certain demanded error rate is not preferable from the viewpoint of the realization of a satisfactory transmission characteristic in the light transmission system. That is, the lower the error rate, the better the light transmission system.

In practical use, however, errors due to the mode hopping rarely occur, and it is difficult to clarify the cause thereof when they do occur. When mode hopping occurs in the semiconductor laser at a rate above the demanded error rate, the measurement of the rate of the mode hopping has heretofore been difficult. Furthermore, it has been difficult to properly select a semiconductor laser by measures taken in advance. Accordingly, the measurement of the error rate has inevitably been carried out under the condition that the laser is incorporated into the light transmission system.

In this type of measurement, however, even if an error is detected in the receiving system, it is impossible to exactly discriminate whether the error is caused by the semiconductor laser or by the transmission line such as an optical fiber line. Namely, as stated above, it has been hard to make clear what caused the occurrence of the error. Therefore, when an error occurs with an error rate above the demanded error rate in a conventional light transmission system, in order to find out whether the cause of the error is due to the mode hopping of the laser, it becomes necessary to make an adjustment for all of the main elements constituting the whole system including the transmitting and receiving system for maintenance of the quality of the transmission characteristic to a constant level. This makes works or operations extremely troublesome or complicated and thus is not preferable.

SUMMARY OF THE INVENTION

An object of the present invention is to provide an arrangement capable of determining whether or not a semiconductor laser is functional with simplicity and high reliability, and without troublesome labor.

The above object is attained by discriminating presence of a sign of "1", i.e., a pseudo-pulse at a specific position in a regenerative pulse pattern, where a sign of "0" should appear, within a predetermined time interval.

Thus, according to the present invention, there is provided an arrangement for determining whether a semiconductor laser for transmitting equipment of a light transmission system is functional or non-functional due to a mode hopping, the arrangement including: a circuit for generating a pulse pattern repeatedly with a unit of a plurality of bits and feeding the pulse pattern to the semiconductor laser; a medium with a chromatic dispersion for passing a light pulse signal output from the semiconductor laser; and receiving equipment operatively connected via the medium to the transmitting equipment, including a circuit for regenerating the pulse pattern from the light pulse signal and outputting a regenerative pulse pattern, and a discriminating circuit for discriminating whether or not a pseudo-pulse exceeding a predetermined threshold level appears at a specific position in the regenerative pulse pattern during a predetermined time interval, thereby indicating whether the semiconductor laser is functional or non-functional due to mode hopping.

BRIEF DESCRIPTION OF THE DRAWINGS

Other objects and features of the present invention will be described hereinafter in detail by way of preferred embodiments, with reference to the accompanying drawings, in which;

FIGS. 4a to 4g are waveform diagrams for explaining an operation of the arrangement shown in FIG. 2; and FIGS. 5a to 5e are waveform diagrams for explaining a form of generation of the pulse pattern Pn employed in another embodiment of the present invention.

DESCRIPTION OF THE PREFERRED EMBODIMENTS

For a better understanding of the preferred embodiments, the problem of the prior art will now be explained with reference to FIG. 1.

Figure 1:
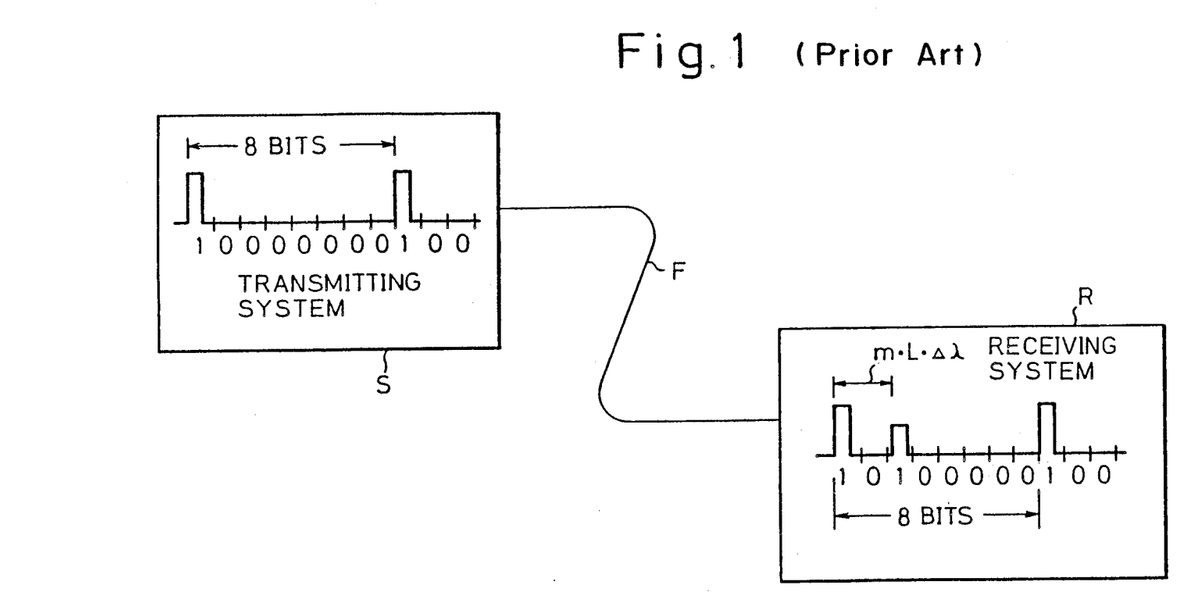
FIG. 1 is a diagram for explaining the problem in a light transmission system employing a semiconductor laser in the transmitting system.

FIG. 1 schematically shows a diagram for explaining a problem in a light transmission system employing a semiconductor laser (not shown) in a transmitting system S.

Assuming that a chain of current pulses for driving the semiconductor laser has an eight-bit formation, for example, "10000000". Where a data transmission is carried out correctly or exactly, a pulse signal having the same bit formation as the current pulses can or must be regenerated in the receiving system R. However the mode hopping occurs in the laser, an error arises in that, in the position where a sign of "0" should appear (in the illustrated example, in the third pulse position), a pseudo-pulse, i.e., a sign of "1", appears. The position at which the pseudo-pulse appears is defined by a dispersion coefficient m of a medium such as an optical fiber F, a length L thereof, and a fluctuation $\Delta\lambda$ from the dominant mode of the wavelength occurring due to the mode hopping of the laser.

Although the error caused by the mode hopping occurs indeterminately, the error rate exceeding a certain demand error rate is undesirable from a viewpoint of the realization of a satisfactory transmission characteristic in the light transmission system. A high bit rate data transmission system has recently been developed in the light transmission system and, to ensure a high quality transmission characteristic, it is demanded or recommended to treat as "error free" at an error rate of approximately $10^{-11}$. Note, an error rate of $10^{-11}$ means that, when the semiconductor laser is driven by $10^{11}$ current pulses of, a single error occurs. Nevertheless, an error in the system often occurs at the rate of $10^{-10}$, and the cause of occurrence thereof is difficult to make clear, as previously explained.

Thus, the measurement of the error rate must inevitably be carried out under the condition that the laser is kept incorporated into the light transmission system. As a result, it is impossible to determine whether the error is due to the laser, due to the transmitting system, due to the receiving system, or due to the optical fiber F. Accordingly such systems are not preferable.

When an error occurs with an error rate of approximately $10^{-10}$ in the light transmission system, conventionally, the maintenance of the quality of the transmission characteristic to a predetermined level has been carried out by exchanging the laser diode of the semiconductor laser and adjusting the bias current thereof in the transmitting system, and by adjusting the bias voltage of an avalanche photo diode and changing a threshold level. Only after checking the whole system and confirming the whole system is good can it be predicted that the reason for the error is the mode hopping of the laser. However, this makes works or operations extremely troublesome or complicated. Moreover it is only prediction.

A preferred embodiment of the present invention will now be described in detail with reference to FIGS. 2 to 4g.

Figure 2:
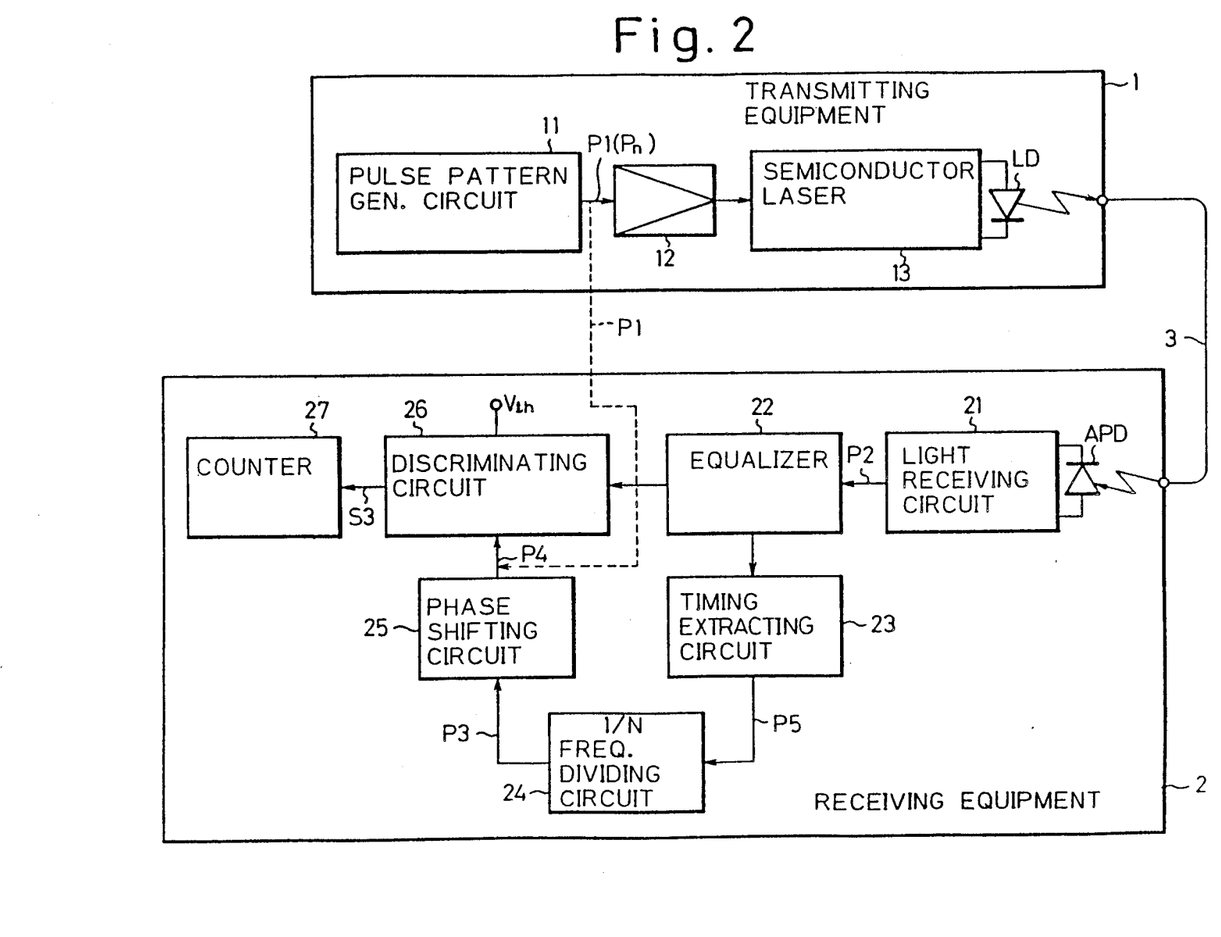
FIG. 2 is a block diagram illustrating a structure of an arrangement as an embodiment of the present invention.

FIG. 2 illustrates a structure of an arrangement, which discriminates whether a semiconductor laser is functional or not, as an embodiment of the present invention. The arrangement of FIG. 2 illustrates a form of a semiconductor laser discrimination system employing the semiconductor laser which is similar to the transmitting systems and is constituted by a transmitting equipment 1, a receiving equipment 2 and an optical fiber 3 for connecting the transmitting and receiving equipment. The optical fiber 3 has a known dispersion coefficient m (ps/km/nm) and a predetermined length L (km).

In the transmitting equipment 1, 11 denotes a pulse pattern generating circuit, which repeatedly generates a pulse pattern P1 having a eight-bit formation with a bit rate of 2 Gb/s. The pulse pattern P1 is generated with a RZ (return to zero) mode and consists of a sign in "1" of one bit and a sign in the remaining "0" of seven bits. The generated pulse pattern P1 is input to an amplifier 12, which amplifies the pulse pattern up to the level necessary for the oscillation of the subsequent semiconductor laser 13. The semiconductor laser 13 is includes, for example, a distributed feedback (DFB) laser. The laser 13 is modulated in the RZ mode by current pulses fed via the amplifier 12 and oscillates a laser beam with a single wavelength, i.e., a light pulse signal, which is transmitted via the optical fiber 3 to the receiving equipment 2.

In the receiving equipment 2, 21 denotes a light receiving circuit having an avalanche photo-diode (APD), which regenerates the pulse pattern P1 from the light pulse signal transmitted via the optical fiber 3. The regenerated or regenerative pulse pattern is indicated by reference P2. Reference 22 denotes an equalizer provided for compensating an attenuation characteristic in the transmission line, i.e., the optical fiber 3, and reshaping the waveform to obtain maximum signal to noise ratio. Reference 23 denotes a timing extraction circuit, which has a function of extracting a clock pulse P5 from the regenerative pulse pattern P2. The timing extraction circuit 23 includes a band-pass filter which passes only a specific frequency. Therefore, the clock pulse P5 has the same frequency as the bit rate of the transmitting data. Reference 24 denotes a 1/N frequency dividing circuit, which divides a frequency of the clock pulse P5 into one-eighth. The frequency divided clock pulse is indicated by reference P3.

Reference 25 denotes a phase shifting circuit, which has a function of shifting the phase of the frequency divided clock pulse P3 by a predetermined phase difference $\phi$ from the position of the sign of "1" in the frequency divided clock pulse P3. The phase shifted clock pulse is indicated by reference P4. In the present example, the phase difference $\phi$ is selected as a time interval corresponding to time width of each bit of the regenerative pulse pattern P2, or more. The phase shifted pulse pattern P4 is input, together with the pulse pattern P2 fed from the light receiving circuit 21, to a discriminating circuit 26, which will be described later. Reference 27 denotes a counter effecting a counting operation based on a discrimination signal S3 which is output from the discriminating circuit 26.

Figure 3:
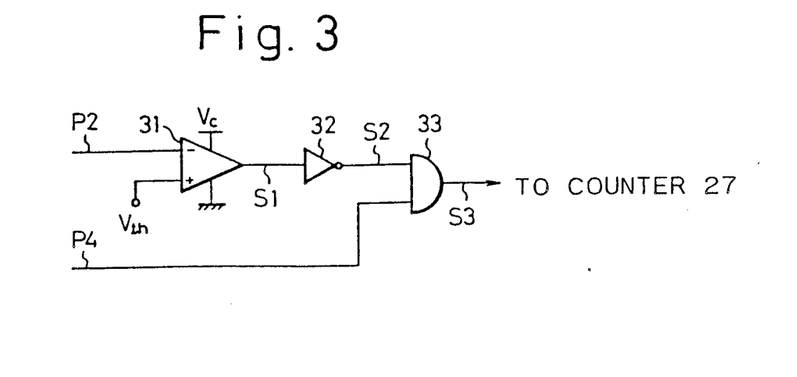
FIG. 3 is a circuit diagram illustrating a construction of the discriminating circuit shown in FIG. 2.

Next, a construction of the discriminating circuit 26 will be described with reference to FIG. 3. The illustrated circuit includes an operational amplifier 31, an inverter 32 and an AND gate 33.

The operational amplifier 31 compares the level of the regenerative pulse pattern P2 with a predetermined threshold level $V_{th}$, and outputs a signal S1 which a low level (voltage of zero) when the former is higher than the latter in level. Inversely, the amplifier 31 outputs a signal S1 which a high level (voltage of $V_c$) when the former is lower than the latter in level. In this case, the threshold level $V_{th}$ is selected to a level lower than that of a pseudo-pulse occurring due to the mode hopping of the laser, as stated later. An output S1 of the amplifier 31 is input via the inverter 32, whose output is indicated by reference S2, to one input end of the AND gate 33. Another input end of the gate 33 receives the phase shifted clock pulse P4. The output of the AND gate 33 is input to the counter 27 as the discrimination signal S3.

Next, the operation of the arrangement shown in FIG. 2 will be explained with reference to FIG. 3 and the waveform diagrams shown in FIGS. 4a to 4g.

Figure 4A:
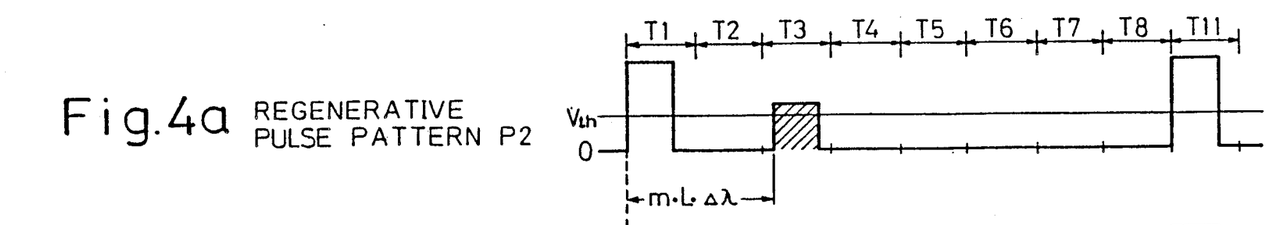

First, we assume that a portion of light of the dominant mode is shifted by a wavelength of $\Delta\lambda$ to the next mode (mode hopping). This portion of light passes through the optical fiber 3 and, as shown in FIG. 4a, forms a pseudo-pulse at the time position (time slot T3) delayed by a time of $m \cdot L \cdot \Delta\lambda$ from the position of the sign of "1" (time slot T1) in the regenerative pulse pattern P2.

Figures 4B, 4C:
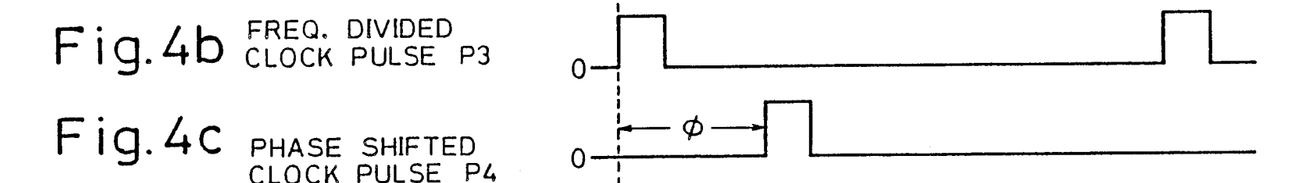

The regenerative pulse pattern P2 is input via the equalizer 22 and timing extracting circuit 23 to the 1/N frequency dividing circuit 24, where the clock pulse P5 is divided in frequency by eight (see FIG. 4b). Furthermore, the frequency divided clock pulse P3 is input to the phase shifting circuit 25, where it is shifted by the predetermined phase difference $\phi$ from the position of the sign of "1" (see FIG. 4c). In this case, a pulse width of the phase shifted clock pulse P4 may be selected broader than that of the original pulse signal P2, or narrower. However, the pulse width is selected to be shorter than a time interval corresponding to the length of the eight-bit formation subtracted by one bit. Since $\Delta\lambda$ is not predictable, the shifting phase difference $\phi$ should be changed from $T_2$ through $T_8$ so that every expected positioned pseudo-pulse can be detected.

Figure 4D:
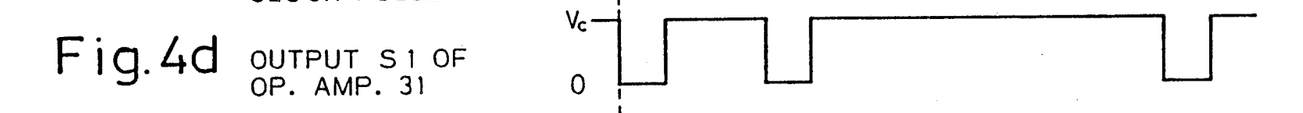
Figure 4E:
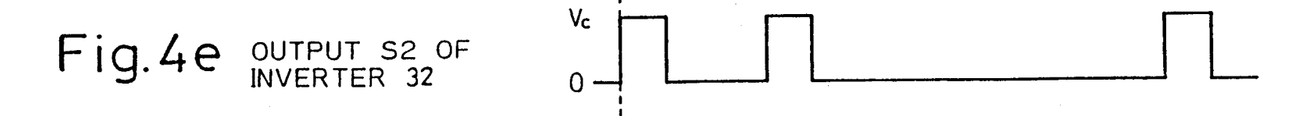

The phase shifted clock pulse P4 is input to one input end of the AND gate 33 in the discriminating circuit 26. On the other hand, the regenerative pulse pattern P2 is input via the equalizer 22 to the operational amplifier 31 in the discriminating circuit 26, where it is compared with the predetermined threshold level $V_{th}$ (see FIGS. 4a and 4d). The signal S1 generated based on the comparison is input via the inverter 32 (see FIG. 4e) to another input of the AND gate 33.

Figure 4F:
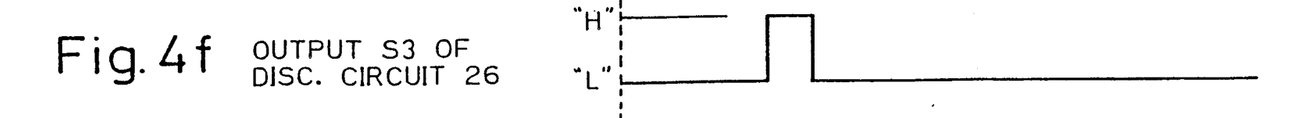
Figure 4G:
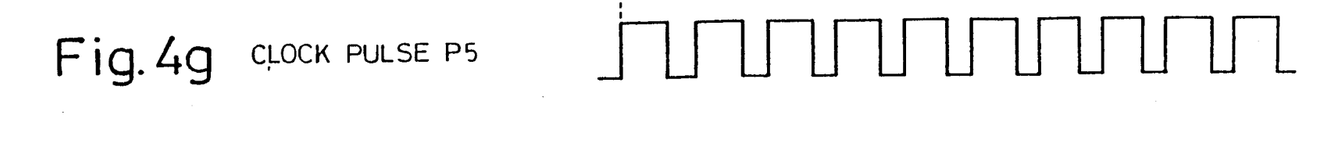

As a result, the output of the AND gate 33, i.e., the output S3 of the discriminating circuit 26, is at a high level during a time position corresponding to the position of occurrence of the pseudo-pulse, as shown in FIG. 4f. Therefore, the counter 27 effects a counting operation. In this case, by measuring whether or not the counting operation is carried out while a preset number of pulses, e.g., pulses of $10^{11}$, are generated by the pulse pattern generating circuit 11, it is possible to detect whether or not mode hopping occurs in the semiconductor laser with an error rate of $10^{-11}$. Namely, it becomes possible to discriminate whether or not the laser is functional.

In addition, it is possible to obtain a value of mode hopping ($\Delta\lambda$) from the relation of $\phi/mL$ by making the width of the frequency divided clock pulse narrower than the original pulse width and gradually changing the phase difference $\phi$ of the divided clock pulse to check on the relation between the number of counts and the phase difference $\phi$. In the illustrated embodiment, although the pulse pattern P1 is a set of 8 bits, such number of the bits can be selected depending upon the situation, i.e., m, L, $\Delta\lambda$.

Although, in the described and illustrated embodiment, the arrangement is constructed to detect whether or not mode hopping occurs in the semiconductor laser by carrying out a phase shift the clock signal P5 extracted from the regenerative pulse pattern P2 in the receiving side of the light transmission system, the arrangement is not to this construction. For example, it is also possible to have the arrangement come within the transmitting side of the system.

Another embodiment is shown in FIGS. 5a to 5e, which illustrates an alternative form of generation of the pulse pattern Pn employed in another embodiment of the present invention. The structure of the arrangement (not shown) of the embodiment is substantially the same as that of FIG. 2, except that the timing extracting circuit 23, 1/N frequency dividing circuit 24 and phase shifting circuit 25 are unnecessary in the receiving equipment. Moreover, the pulse pattern P1 is fed to the discriminating circuit 26 as shown in FIG. 2 with a broken line. That is, the original pulse pattern P1 is employed as the pulse pattern P4 to be input to the discriminating circuit 26, and an output gate is used which outputs a signal of a high level when a combination of "1" and "0" is applied thereto. Also, the pulse pattern generating circuit 11 does not output an identical pulse pattern repeatedly with a unit of a plurality of bits as in the embodiment of FIGS. 2 and 4, but outputs a specific pulse pattern as shown in FIGS. 5a to 5e, where the number of signs of "0" inserted adjacent to the signs of "1" is increased in sequence one by one from zero to a predetermined value (in the illustrated example, four). By utilizing the specific pulse pattern, the following characteristics in operation are expected.

When a portion of light of the dominant mode of the semiconductor laser is shifted by a wave length of $\Delta\lambda$ (mode hopping), it forms a mode partition noise. When the noise passes through the optical fiber and is input to the receiving equipment, a pseudo-pulse is formed at the position delayed by the time of $m \cdot L \cdot \Delta\lambda$ from the position of the sign of "1" in the regenerative pulse pattern. Where the pseudo-pulse occurs in the position of the sign of "1" in each pattern shown in FIGS. 5a to 5e, it is treated as data of "1" in the receiving equipment, although it really indicated an error. Namely, it is brought to the state of "error free".

In the present embodiment, when the phase of the pulse pattern to be applied to the semiconductor laser is changed in the manner as shown in FIGS. 5a to 5e, the state of "error" and the state of "error free" are found in the receiving side. Accordingly, by utilizing the presence of both states, it becomes possible to exactly discriminate whether the occurrence of the error is due to the transmitting side (mainly, the mode hopping of the diode LD) or due to the receiving side (mainly, the noise of the diode APD).

Figure 5A:
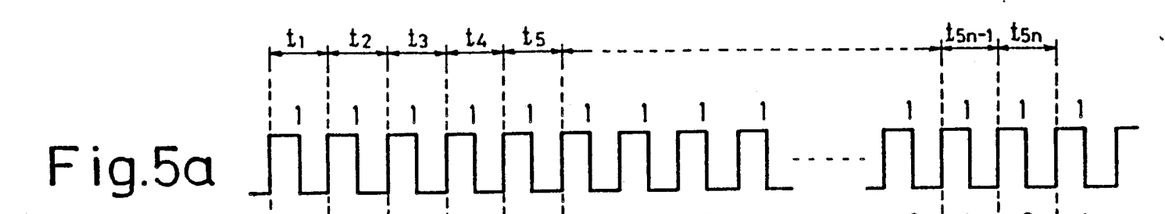
Figure 5B:
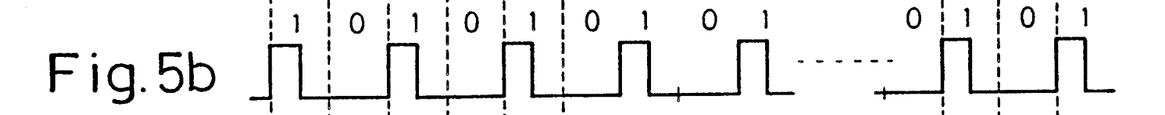
Figure 5C:
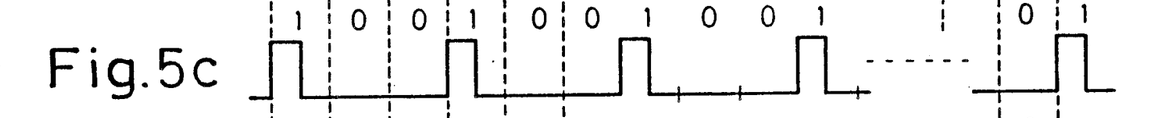
Figures 5D, 5E:
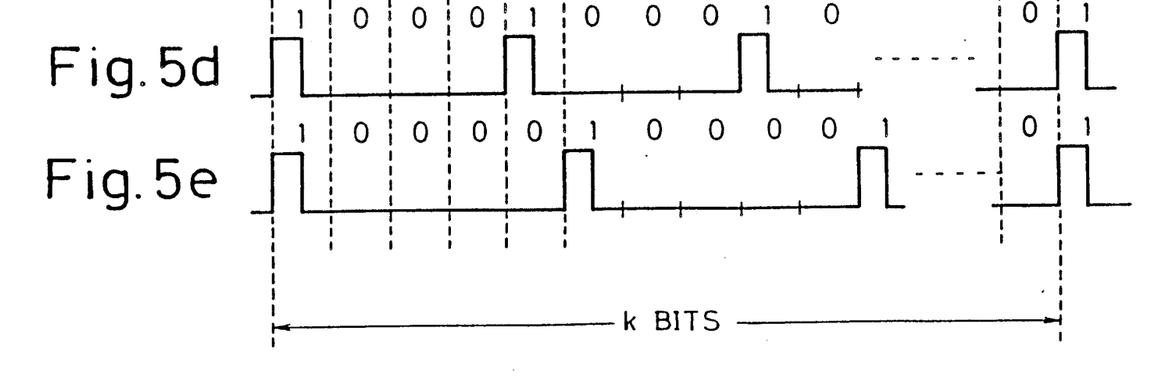

For example, assuming that, in the illustration of FIGS. 5a to 5e, a time slot t1 is set as basis and a pseudo-pulse occurs in a time slot t3. The pulse pattern of FIG. 5a represents the state of "error free"; that of FIG. 5b "error free"; that of FIG. 5c "error"; that of FIG. 5d "error"; and that of FIG. 5e "error". As a result, it is found that the error occurs due to the transmitting side, mainly, the diode LD. If the error occurs due to the receiving side, all of the patterns shown in FIGS. 5a to 5e are brought to the state of "error". In other words, when the presence of both of the states "error" and "error free" is detected in the receiving side, it is possible to detect that the semiconductor laser of the transmitting side is "non-functional".

Although the present invention has been disclosed and described by way of only two embodiments, it is apparent to those skilled in the art that other embodiments and modifications of the present invention are possible without departing from the spirit or essential features thereof.

We claim:

1. An arrangement for discriminating whether a semiconductor laser of transmitting equipment is functional or non-functional due to mode hopping, said arrangement comprising:

a pulse pattern generating circuit, operatively connected to the semiconductor laser, for generating a pulse pattern repeatedly with a unit of a plurality of bits and outputting the pulse pattern to the semiconductor laser;

a medium, operatively connected to the semiconductor laser, with a chromatic dispersion for passing a light pulse signal output from the semiconductor laser; and receiving equipment, operatively connected via said medium to the transmitting equipment, comprising a receiving circuit, operatively connected to said medium, for regenerating the pulse pattern from the light pulse signal and outputting a regenerative pulse pattern, and a discriminating circuit, operatively connected to said receiving circuit, for discriminating whether or not a pseudo-pulse exceeding a predetermined threshold level appears at a specific position in the regenerative pulse pattern during a predetermined time interval, the pseudo-pulse occurring because the light pulse signal output from the semiconductor laser is subjected to the chromatic dispersion while passing through said medium, thereby indicating a result of whether the semiconductor laser is functional or non-functional due to mode hopping.

2. An arrangement as set forth in claim 1,
wherein the pulse pattern has an identical bit arrangement and includes a sign of "1" in one bit of the plurality of bits;
wherein said receiving equipment further comprises
a timing extracting circuit, operatively connected to said receiving circuit, for generating a clock pulse with the same frequency as a bit rate of the pulse pattern,
a frequency dividing circuit, operatively connected to said timing extracting circuit, for dividing the clock pulse in frequency with the number of bits of the pulse pattern and outputting a divided clock pulse, and
a phase shift circuit, operatively connected to said frequency dividing circuit, for shifting the divided clock pulse by a predetermined phase difference and outputting a shifted clock pulse; and
wherein said discriminating circuit compares a level of the regenerative pulse pattern with the predetermined threshold level and carries out the discriminating operation based on the comparison between the regenerative pulse pattern and the shifted clock pulse.

3. An arrangement as set forth in claim 2, wherein the specific position is selected as a position shifted by a predetermined time from a position of a signal of "1" indicating a basic position in the regenerative pulse pattern, the predetermined time being defined by a dispersion coefficient and a length of said medium and a fluctuation in wavelength occurring due to mode hopping of the semiconductor laser.

4. An arrangement as set forth in claim 3, wherein said receiving equipment further comprises a counter, operatively connected to said discriminating circuit, for effecting a counting operation when said discriminating circuit discriminates that the pseudo-pulse appears at the specific position and, based on whether or not the counting operation is carried out, a result of whether the semiconductor laser is functional or non-functional is indicated.

5. An arrangement as set forth in claim 2, wherein the predetermined phase difference is selected to correspond to the predetermined time interval corresponding to at least a time width of each bit of the regenerative pulse pattern.

6. An arrangement as set forth in claim 5,
wherein said discriminating circuit comprises:
an operational amplifier, operatively connected to said receiving circuit, for comparing the level of the regenerative pulse pattern with the predetermined threshold level and outputting a comparison signal, and
an AND gate, operatively connected to said phase shift circuit and said operational amplifier, for receiving as inputs the shifted clock pulse and a signal corresponding to the comparison signal and outputting a discrimination signal; and
wherein said counter effects the counting operation based upon the discrimination signal.

7. An arrangement as set forth in claim 1, wherein the pulse pattern has a specific pulse pattern formed in such a manner that a number of signs of "0" inserted into adjacent signs of "1" is increased in sequence one by one from zero to a predetermined value.

8. An arrangement as set forth in claim 6, wherein said discriminating circuit compares a level of the regenerative pulse pattern with the predetermined threshold level and carries out the discriminating operation based on the comparison.

9. An arrangement as set forth in claim 1, wherein the predetermined threshold level is set to a level lower than a level of the pseudo-pulse occurring due to the mode hopping of the semiconductor laser.

10. An arrangement as set forth in claim 9, wherein said receiving equipment further comprises a counter, operatively connected to said discriminating circuit, for effecting a counting operation when said discriminating circuit discriminates that the pseudo-pulse appears at the specific position and, based on whether or not the counting operation is carried out, a result of whether the semiconductor laser is functional or non-functional is indicated.

11. An arrangement as set forth in claim 10,
wherein said discriminating circuit comprises:
an operational amplifier, operatively connected to said receiving circuit, for comparing the level of the regenerative pulse pattern with the predetermined threshold level and outputting a comparison signal, and
an AND gate, operatively connected to said operational amplifier, for receiving as inputs the specific pulse pattern and a signal corresponding to the comparison signal and outputting a discrimination signal; and
wherein said counter effects the counting operation based upon the discrimination signal.

12. A system for determining if a semiconductor laser is causing an excessive error rate due to mode hopping during a transmission of a light pulse signal corresponding to a pulse pattern over a transmission line, comprising:
regenerative means for receiving the light pulse signal from the transmission line and outputting a regenerative pulse pattern; and
determining means for determining if a pseudo-pulse, due to mode hopping, exceeding a predetermined threshold level appears at a specific position of the regenerative pulse pattern during a predetermined time, the pseudo-pulse occurring because the light pulse signal from the semiconductor laser is subjected to chromatic dispersion while passing through the transmission line.

13. A system as set forth in claim 12, wherein said determining means comprises:
   an operational amplifier, operatively connected to said regenerative means, for comparing the level of the regenerative pulse pattern with the predetermined threshold level and outputtig a comparison signal, and
   an AND gate, operatively connected to said operational amplifier, for receiving as inputs the specific pulse pattern and a signal corresponding to the comparison signal and outputting a determination signal.

14. A system as set forth in claim 13, wherein the specific position is selected as a position shifted by a predetermined time from a position of a sign of "1" indicating a basic position in the regenerative pulse pattern, the predetermined time being defined by a dispersion coefficient and a length and a fluctuation in wavelength.

* * * * *

UNITED STATES PATENT AND TRADEMARK OFFICE
CERTIFICATE OF CORRECTION

PATENT NO. : 4,989,949

DATED : FEBRUARY 5, 1991

INVENTOR(S) : HAJIME IMAI ET AL.

It is certified that error appears in the above-identified patent and that said Letters Patent is hereby corrected as shown below:

Title page:
   Under References Cited, please add the following:

--Foreign Patent Documents

DE 3314869, filed October 25, 1984, West Germany

Other Documents

Patent Abstracts of Japan, vol. 6 no. 164, August 27, 1982 (JP-A-57-83079)

S. Yamamoto et al; "Stability of Two-Modes in DFB Laser Diode Under High Data Rate Modulation", ELECTRONICS LETTERS, vol. 20, no. 6, March 15, 1984, London, GB EUROPEAN SEARCH REPORT for EP-88-30-9917, THE HAGUE, January 12, 1990--.

Signed and Sealed this

Fifteenth Day of September, 1992

*Attest:*

DOUGLAS B. COMER

*Attesting Officer*       *Acting Commissioner of Patents and Trademarks*